United States Patent [19]
DeVries

[11] 3,987,379
[45] Oct. 19, 1976

[54] ACOUSTIC SURFACE WAVE FILTER HAVING COMBINED SPLIT-ISOLATED AND SPLIT-CONNECTED COUPLER

[75] Inventor: Adrian J. DeVries, Elmhurst, Ill.

[73] Assignee: Zenith Radio Corporation, Chicago, Ill.

[22] Filed: Jan. 2, 1976

[21] Appl. No.: 646,117

[52] U.S. Cl. .................................. 333/72; 310/9.8; 333/30 R
[51] Int. Cl.² ..................... H03H 9/26; H03H 9/32; H01L 41/04; H01L 41/10
[58] Field of Search ................ 333/30 R, 72; 310/8, 310/8.1, 8.2, 9.8

[56] References Cited
UNITED STATES PATENTS

| | | | |
|---|---|---|---|
| 3,836,876 | 9/1974 | Marshall et al. | 333/72 X |
| 3,947,783 | 3/1976 | Maerfeld | 333/30 R |

Primary Examiner—Alfred E. Smith
Assistant Examiner—Marvin Nussbaum
Attorney, Agent, or Firm—Roy A. Ekstrand

[57] ABSTRACT

An acoustic surface wave filter has offset transmitting and receiving transducers formed on the wave propagating surface of a piezoelectric substrate. A two-segment multistrip coupler is interposed on the propagating surface and provides "track switching" or "sidestepping" action for signals within the coupler passband. The coupler includes a split-connected portion formed by electrically connected filamentary conductor pairs and a split-isolated portion formed by electrically continuous filamentary conductors and interleaved conductors having a discontinuity at their center. The split-connected portion attenuates the symmetrical mode components of acoustic waves within the coupler stop band while the split-isolated portion attenuates the anti-symmetrical mode portion of acoustic waves within the coupler stop band, producing an improved trap response.

7 Claims, 2 Drawing Figures

ACOUSTIC SURFACE WAVE FILTER HAVING COMBINED SPLIT-ISOLATED AND SPLIT-CONNECTED COUPLER

CROSS REFERENCE OF RELATED APPLICATION

The subject matter of this application is related to, but not dependent upon, the invention disclosed and claimed in application Ser. No. 645,488, filed Dec. 31, 1975, in the name of Adrian J. DeVries, entitled "ACOUSTIC SURFACE WAVE DEVICE HAVING SPLIT-ISOLATED OR SPLIT-CONNECTED MULTISTRIP COUPLER," and assigned to Zenith Radio Corporation.

BACKGROUND OF THE INVENTION

This invention relates generally to surface wave integratable filters (SWIF's) and specifically to those utilizing multistrip couplers (MSC).

SWIF devices generally comprise piezoelectric substrates upon which transmitting and receiving transducer pairs are formed. The transducers, whether receiving or transmitting, are typically formed by pairs of electrically conductive comb-like structures having interleaved fingers. When a voltage is applied between the comb-like structures of a transmitting transducer, the piezoelectric material of the substrate's surface is stressed and deformed causing a conversion of electrical energy to mechanical energy in the form of acoustic surface waves which propagate across the medium surface to impinge the receiving transducer. A second energy conversion takes place at the receiving transducer in which a portion of the mechanical energy of the acoustic surface wave is reconverted to electrical energy, developing a voltage between comb elements.

While a simple single transducer section, formed by two adjacent fingers of one comb element and the interleaved finger of the other, is capable of launching or receiving surface waves, in practice many transducer sections are combined in a more complex transducer structure. In multiple section transducers, such as are generally used, the total launched or received wave is the cumulative effect of the individual transducer sections. Transducers define a single maximum energy or primary propagation and reception axis. While most propagation occurs along this axis, a small but significant amount is radiated in or received from other directions. Generally the primary axis is in essentially orthogonal alignment with the transducer fingers while these other energy transfer directions are non-orthogonal.

When electrically stimulated, transmitting transducers produce both surface waves (propagating at or near the medium surface) and bulk mode waves (propagating deep within the medium). Bulk mode waves are undesirable in surface wave devices because they often reflect off substrate boundaries and impinge the receiving transducer, causing spurious responses which often have a different time delay and exhibit a completely different frequency response.

The deleterious effect on the transfer function caused by the undesired bulk waves may be avoided by offsetting the transmitting and receiving transducers and sidestepping the wave propagation. In sidestepping SWIF devices, the transducers are laterally offset, that is, their primary axes are parallel but not coincident, and an interposed multistrip coupler is positioned orthogonal to the primary axes. Surface waves propagated along the primary axis of the transmitting transducer are "converted" to surface waves along the primary axis of the offset receiving transducer. Simply stated, the sidestepping effect of the multistrip coupler assures that surface waves launched by the transmitting transducer, which are offset by the multistrip coupler, reach the receiving transducer while bulk waves, which are not offset by the multistrip coupler, do not.

The action of such multistrip couplers is best described by analysis of the respective symmetrical and antisymmetrical mode components of the launched acoustic wave as it travels through the coupler. Once the acoustic wave is resolved into symmetrical and anti-symmetrical mode components, their propagation can be considered individually and the total output wave derived by superposition of the individual mode components. Because the multistrip coupler elements are spaced periodically upon the propagating surface, the coupler has an inherent broad bandpass frequency characteristic with a stop band or "notch" for signals having acoustic wavelengths approximately twice the element spacing. An understanding of coupler action is best obtained by analysis of signals outside the coupler stop band. Therefore, the discussions which follow will initially deal with them.

As mentioned above, the primary axes of the transmitting and receiving transducers are parallel, but offset. The individual transducer primary axes define separate "tracks" or channels symmetrical about an imaginary centerline drawn through the coupler orthogonal to its elements. The resultant structure is a first track through one half of the coupler in alignment with the transmitting transducer and a second track through the other half of the coupler in alignment with the receiving transducer.

A symmetrical mode component is a wave component distributed equally along an entire coupler element, that is, the waves in both tracks are in phase. An anti-symmetrical mode component is an acoustic wave having components in each track of equal amplitude and opposite phase. When an anti-symmetrical mode wave is combined with a symmetrical mode wave of the same amplitude, the result resembles an acoustic surface wave in one half of the coupler array only, the two modes having a null effect in the other half. Hence an acoustic surface wave incident upon half the coupler array is effectively divided equally between symmetrical mode and anti-symmetrical mode components.

The anti-symmetrical mode component tends to result in an uneven voltage distribution across the coupler element causing a corresponding element current as the voltage distribution equalizes. In contrast, the symmetrical mode component produces a unifom voltage distribution across the element and no equalizing current is produced. As a result, the anti-symmetrical component has a slower propagation velocity than the symmetrical. As the two mode components advance through the coupler the propagational velocity difference gives rise to an increasing phase displacement between the mode components. In the typical sidestepping device, the coupler is sufficiently long to develop a 180° phase shift.

At this point all the acoustic energy originally emanating from the transmitting transducer propagating in the first track has been "switched over" and now propagates away from the coupler in the second track toward the receiving transducer.

As mentioned, the multistrip coupler has a broad passband response and a notch or stop band corresponding to signals having acoustical wavelengths approximately twice the coupler element spacing. Acoustic surface waves within this range of wavelengths are usually attenuated relative to those outside it. In applications requiring a continuous relatively flat coupler response over an extended range of signal frequencies, element spacing is selected such that the stop band occurs well outside the frequencies of interest. In the more typical applications in which the acoustic device functions as a filter, it is intended to exhibit a predetermined frequency characteristic, passing a selected range of signals while attenuating others. Coupler element spacing in such acoustic filters can be selected such that the stop band corresponds to signals sought to be trapped or attenuated.

If, for example, an acoustic surface wave device is used as the intermediate frequency filter for an NTSC color television receiver, several alternatives arise. Element spacing may be selected to provide a stop band at the lower frequency end of the filter response corresponding to signals at the adjacent picture carrier frequency (39.75 MHz) or the stop band may be located at the higher frequency end of the filter response corresponding to the adjacent channel sound carrier frequency (47.25 MHz). Using this approach, approximately 10 decibels (db) of attenuation within the coupler may be achieved. However, the trap produced is extremely narrow making consistency difficult to achieve. Therefore, while the trap achieved by such use of coupler periodicity has reasonable attenuation, it is prohibitively narrow for typical manufacturing operations.

OBJECTS OF THE INVENTION

Accordingly, it is a general objective of the present invention to provide an improved multistrip coupled acoustic surface wave device.

It is a more particular object of the present invention to provide an acoustic surface wave device having improved trap characteristics.

SUMMARY OF THE INVENTION

An acoustic surface wave filter has transmitting and receiving transducers and a multistrip coupler formed on a surface wave propagating medium. The multistrip coupler defines a passband and stop band and includes a first portion attenuating the symmetrical mode component of signals within the coupler stop band and a second portion attenuating the anti-symmetrical mode component of signals within the coupler stop band.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
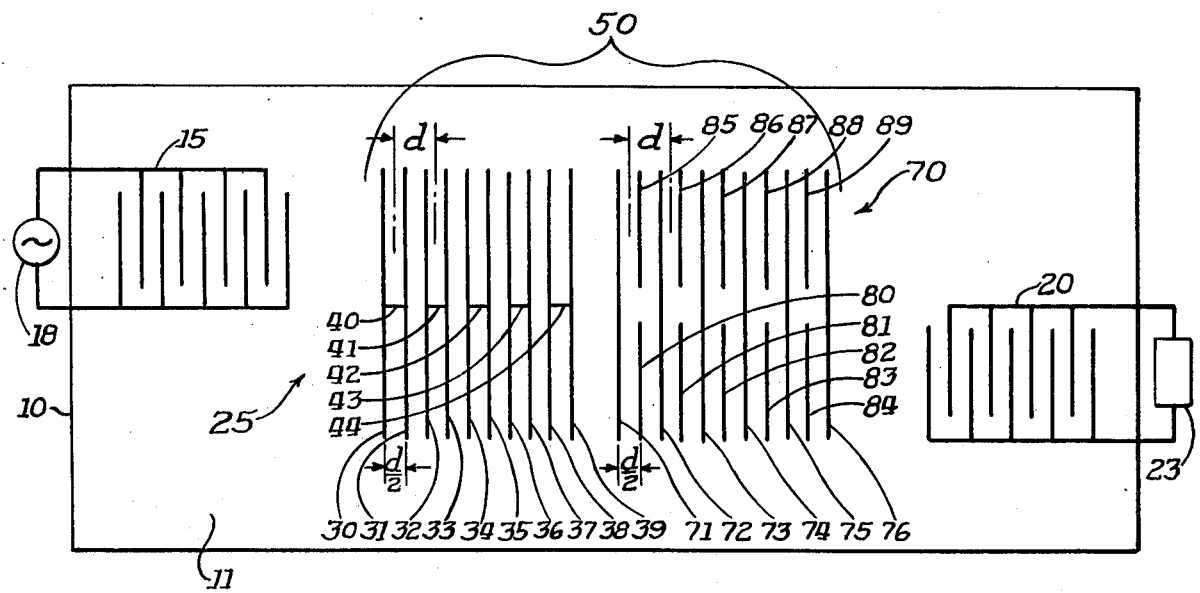
FIG. 1 is an acoustic surface wave device constructed in accordance with the present invention.

FIG. 1 shows a sidestepping acoustic integratable surface wave filter (SWIF) constructed in accordance with the present invention. A piezoelectric substrate 10 defines a substantially planar wave propagating surface 11 upon which a transmitting transducer 15 and receiving transducer 20, each comprising a pair of interleaved comb-like deposited metal structures, are formed in an offset configuration. A source of alternating signal 18 is connected to transducer 15 and a load 23 is connected to transducer 20. A multistrip coupler 50 is interposed between transducers 15 and 20 and includes a split connected coupler portion 25 and a split-isolated coupler portion 70. It should be obvious that the positions of coupler portions 25 and 70 may be reversed without departing from the spirit of the present invention. Coupler portion 25 comprises a plurality of elongated filamentary conductors 30–39 (spaced by a distance d/2) parallel to the fingers of transducers 15 and 20. A group of interconnecting stubs 40–44 provide electrical connections between alternate conductor pairs forming H-shaped filamentary pairs 30–31, 32–33, 34–35, 36–37 and 38–39. Each H-shaped structure comprises a split-connected coupler element, or section, spaced from each adjacent element by a distance d. Coupler portion 70 comprises a plurality of elongated filamentary conductors 71–76 spaced by a distance d and parallel to the fingers of transducers 60 and 65. A second group of filamentary conductors 80–89 approximately half the length of conductors 71–76 are interleaved between adjacent pairs of conductors 71–76 and spaced d/2 from adjacent full-length conductors. Each conductor triad, comprising one full-length and two adjacent half-length conductors, forms a split-isolated coupler element, or section. The center-to-center spacing between elements equals distance d. The individual passbands and stop bands of coupler portions 25 and 70 are intended to be coincident and therefore their element spacings are shown equal. In some applications the difference in metalization structures of the coupler portions may necessitate a slight difference in element spacing to maintain band coincidence. However, because the difference is generally slight, and because it simplifies the explanation, it will be assumed that both couplers have identical element spacing. It should be noted that FIG. 1 is illustrative only and that in a practical structure many more elements, both in the coupler and the transducer, would generally be used. Further, the elements are not shown in true dimension.

In operation, signals within the passband in the form of voltages produced by source 18, establish a time-varying potential between the interleaved halves of transducer 15, stressing the medium and launching acoustic surface waves which produce similar results in both split-connected coupler portion 25 and split-isolated coupler portion 70. The launched waves propagate along a path orthogonal to the transducer fingers and the elements of coupler 50. The waves impinging the first track (the half of coupler 50 in-line with transducer 15) are converted to the second track (the half of coupler 50 in-line with transducer 20). At transducer 20 a voltage is developed and appears across load 23. The total effective length of coupler 50, that is, the sum of coupler portions 25 and 70, is selected such that a 180° phase difference, between the anti-symmetrical and symmetrical mode components of waves leaving coupler portion 70, exists (which is the condition for complete track switching of signals having acoustic wavelengths within the coupler passband). It should be apparent that any coupler with a given length will produce the desired track switching provided an odd number of 180° relative phase differences between the mode components occur. The shortest coupler which fulfills this condition is one in which coupler portions (25 and 70) produce successive 90° differences. It has been found, however, that improved performance is achieved if the couplers are longer, for instance, deep traps were experimentally measured on a device in which each coupler portion provides about a 270° relative phase difference.

The operation of both the split-connected and split-isolated portions of coupler 50 for signals within the coupler stop band, that is, signals having acoustic wavelengths $2d$ (approximately twice the element spacing), however, differs from that of prior art couplers in that split-connected coupler portion 25 attenuates the symmetrical mode component and passes the anti-symmetrical mode component substantially unattenuated while split-isolated coupler portion 70 attenuates the anti-symmetrical mode component and passes the symmetrical mode component unattenuated. The discussions which follow will describe the individual operations of coupler portions 25 and 70 in this relatively narrow stop band in greater detail. However, it need only be noted here that surface waves within the coupler passband are sidestepped by coupler 50 and impinge receiving transducer 20 substantially unaltered. In contrast, signals within the coupler stop band impinging receiving transducer 20 are altered with both the symmetrical and anti-symmetrical mode components being greatly attenuated resulting in a deep trap at stop band frequencies.

Before analyzing the operation of the coupler for signals within the stop band in detail some general discussion of the reflection mechanism within surface couplers may be helpful. Surface wave reflection is primarily due to two mechanisms, acting alone or in combination. The first is purely electrical in nature and occurs whenever a potential difference exists between adjacent conductors on the medium surface. Functioning as a simple transducer, the coupler elements launch a forward-going (direct) wave and a reverse-going (reflected) wave. The second reflection mechanism is a combination of mechanical and electrical effects and is due to the surface discontinuity caused by the presence of the coupler element itself. It is independent of interelement voltages. When a surface wave encounters such a surface discontinuity, a portion of the wave energy is reflected back. Regardless of the caused mechanism, if the reverse-going waves are cumulative due to the particular periodicity of the coupler and acoustic wavelength of the signal, the coupler is reflective.

With this elementary understanding of wave reflection, the individuals behaviors of coupler portions 25 and 70 for signals within the stop band will be described by use of familiar superposition principles. The propagation of acoustic waves, emanating from transducer 15, through the couplers will be described by separating the symmetrical and anti-symmetrical mode components, considering their individual behavior and adding their effects. In addition, the analysis of each mode component reflection will be further divided into discussions of both reflection mechanisms.

Considering the surface discontinuity mechanism during the propagation of a symmetrical mode component through the split-connected structure of coupler portion 25, incidence with each respective filamentary conductor gives rise to a continuing component and a reflected component. As successive symmetrical mode waves travel through the coupler a progression of forward-going acoustic waves arises together with a progression of reverse-going or reflected components. However, because the spacing between filamentary conductors 30–39 is equal to one quarter of an acoustic wavelength, successive reflected components are displaced by half wavelengths (two travel times) and are cancelled. As a result, the reflected components due to surface discontinuity for symmetrical mode components are cumulatively cancelled.

A different situation arises, however, for reflected waves produced by the "purely electrical" mechanism within coupler portion 25. As mentioned, symmetrical mode components encountering a coupler element produce an even voltage distribution across the element. Because the filamentary conductors are paired, that is, electrically connected, a symmetrical mode wave impinging the first conductor of each pair raises the entire H-shaped coupler element to a uniform potential. For example, a wave impinging conductor 30 produces a voltage which, due to connecting stub 40, is also applied to conductor 31. Similarly a wave incident on conductor 32 simultaneously raises conductor 33 to the same potential due to connecting stub 41, and so on. As a result, the H-like elements of coupler portion 25 appear electrically similar to a solid coupler element, and have an effective spacing of one half wavelength. As successive symmetrical wave fronts travel through the coupler, voltages between the coupler elements are produced. Due to these interelement voltages forward-going and reverse-going waves described above are launched by a transducer action. The half wavelength effective spacing between elements causes successive reflected waves to be in phase (two travel times) and the structure becomes reflective. The precentage of energy reflected is a function of the number of coupler elements. In the structure shown, coupler portion 25 is of sufficient length to phase displace the symmetrical and anti-symmetrical mode components of signals within the passband 270°, which is also sufficient to substantially attenuate stop band symmetrical mode components.

Turning now to anti-symmetrical mode component propagation through coupler portion 25, a similar analysis to that carried out for discontinuity reflections yields a similar result. The incidence of a succession of anti-symmetrical mode waves upon conductors 30–39 gives rise to a succession of reflected waves which cancel due to the quarter wavelength spacing of conductors 30–39. As mentioned above anti-symmetrical mode components produce equal antiphase waves within coupler portion 25 which tend to induce equal magnitude-opposite polarity voltage contributions in each half of the coupler element. The combination of equal magnitude-opposite polarity voltages across the coupler element produces zero voltage. In the absence of any voltage produced at the coupler elements, there is no transducer action and neither forward-going or reverse-going waves are launched. Thus the anti-symmetrical mode components propagate through coupler portion 25 unattenuated. The resultant wave leaving coupler portion 25 and propagating toward coupler 70, obtained by addition of the symmetrical and anti-symmetrical mode contributions, has a substantially greater anti-symmetrical than symmetrical mode component.

Turning to the behavior of split-isolated coupler portion 70, the discontinuity mechanism will now be considered. A symmetrical mode component incident upon either a full-length conductor such as 71 or a half-length conductor pair such as 80 and 85 gives rise to a forward-going component (that portion of the incident wave not reflected) travelling on after striking the filamentary element and a reflected component. As successive symmetrical mode waves travel through the coupler a progression of forward-going acoustic waves arises together with a progression of reverse-going or reflected waves. Because both full-length and pairs of half-length conductors produce reflections, the effective spacing between reflecting conductors is equal to one quarter of an acoustic wavelength. As a result successive reflected components are displaced by half wavelengths (two travel times) and are cancelled and no reflection of symmetrical mode components due to discontinuities occur.

A similar situation arises for reflected waves produced by the "purely electrical" mechanism. Symmetrical mode components encountering either a full-length or half-length conductor pair produce an even voltage distribution. In other words because the wave is symmetrical, a full-length conductor and an "in-line" half-length conductor pair appear electrically the same. For example, a wave impinging conductor 71 raises it to a uniform voltage. A symmetrical wave impinging conductor pair 80 and 85 also raises them simultaneously to a uniform voltage. Similarly a wave incident on conductor 72 creates a voltage between it and conductor pairs 80-85 and 81-86. As successive symmetrical wave fronts travel through the coupler, voltages between the conductors are produced giving rise to transducer action and launching forward-going and reverse-going waves. The quarter wavelength spacing between conductors causes successive reflected waves to be 180° out-of-phase (two travel times) cancelling all reflections.

With regard to anti-symmetrical mode component propagation through coupler 70, a similar analysis to that carried out above for reflections due to discontinuities yields a similar result. The incidence of successive anti-symmetrical mode waes on full-length conductors 71-76 and half-length conductors 80-89 gives rise to a succession of reflected waves which cancel due to the quarter wavelength conductor spacing.

As mentioned above, anti-symmetrical mode components comprise equal antiphase waves within the coupler which induce equal and opposite voltages in each half of the coupler conductors. In the case of a full-length conductor, the equal and opposite polarity voltages across the coupler element add to zero. In half-length conductors, however, no combination takes place and each half is raised to a voltage with respect to adjacent in-line half-length conductors. Each half-length pair, therefore, is energized. Because the spacing between adjacent half-length conductors is one half wavelength, reflected waves are in phase and the coupler is reflective. The effect of coupler portion 70, is to attenuate the anti-symmetrical mode component of the stop band signal. The combined effect on signals within the stop band is attenuation of both the symmetrical and anti-symmetrical mode components, producing a deep broad trap within the stop band not attainable with conventional couplers.

Figure 2:
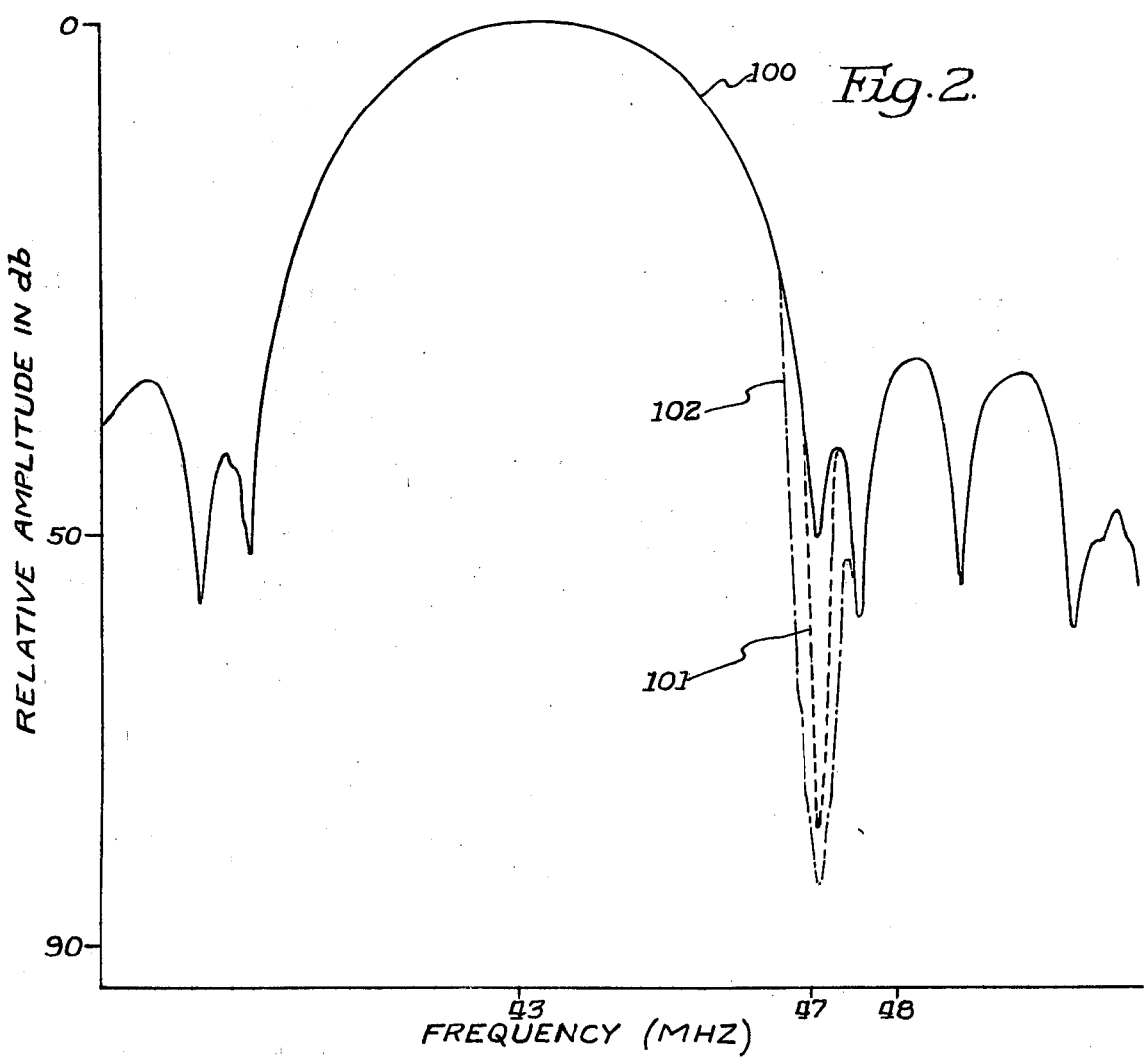
FIG. 2 is a graph of the transfer characteristics of prior art and present invention acoustic surface wave devices.

FIG. 2 is a combined transfer function graph in which relative attenuation in decibels (db) is plotted along the vertical axis and frequency in Megahertz (MHz) along the horizontal. All the curves shown represent devices appropriate for use as a television intermediate frequency filter. A solid curve 100 represents the transfer characteristic of a set of interdigitated transducers defining traps at 47.25 MHz (adjacent sound carrier) and 39.75 MHz (adjacent video carrier). Dashed curve 101 represents the enhancement of the 47.25 MHz trap achieved with a conventional multistrip coupler. A combined dash-dot curve 102 represents the trap enhancement obtained by a coupler constructed in accordance with the present invention. Curves 101 and 102 are based upon a combination of measured data and mathematical calculation rather than imperically derived data.

Comparison of curves 101 and 102 at the stop band frequencies (near 47.25 MHz) shows the present invention trap is deeper and broader than that achieved by the prior art coupler. The additional trap depth of curve 102, of course, indicates signals at 47.25 MHz will receive greater attenuation in the present invention device. This additional attenuation is of considerable importance. However, the greater trap width of the present invention device is perhaps even more important than trap depth when the device is mass produced.

While acoustic surface waves filters are generally manufactured with great precision, some variation in processing does, of course, occur which can change the location of the coupler stop band. The relationship between coupler periodicity and signal frequency is a function of several parameters among them, surface wave velocity and element spacing. Variations of surfave wave velocity produce variations in acoustic wavelengths for any given signal frequency. Similarly, slight variation in element spacing may occur due to tolerances in the photographic process used. The trap width of the present invention accommodates such variation without significant loss of trap attenuation due to its width. The same cannot be said for the relatively narrow trap of conventional couplers.

In addition to device variations, receiver circuit variations due either to tuning inaccuracies or intentional "detuning" may cause the to-be-trapped signal to be converted by the receiver tuning system to a frequency other than the theoretical value. Again, in such case the greater trap width of the present invention device gives greater assurance that the trap will attenuate the undesired signal.

What has been shown is an improved multistrip coupled acoustic surface wave filter in which an improved trap response is achieved. The improved trap is both deeper and broader than those attained by prior art couplers enhancing the consistency of trap response in high volume manufacture.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. An acoustic surface wave filter having a transfer characteristic including a passband and a stop band comprising:
a piezoelectric substrate defining a wave propagating surface;
transmitting and receiving transducer means formed on said surface for launching and receiving acoustic surface waves via a propagation path, said waves resolvable into symmetrical and anti-symmetrical mode components;
a multistrip coupler formed on said surface interposed between said transducer means within said wave propagation path including first coupling means substantially attenuating the symmetrical mode component while coupling the anti-symmetrical mode component of signals within said stop band unattenuated and second coupling means substantially attenuating the anti-symmetrical mode component while coupling the symmetrical mode component of signals within said stop band unattenuated, said first and second coupling means being arranged serially in said propagation path.

2. An acoustic surface wave filter as set forth in claim 1 wherein said first and second coupling means each include a plurality of coupler elements periodically spaced on said surface, the effective periodicity of said elements for signals within said stop band being different for said mode components causing said first coupling means to reflect said symmetrical mode component and said second coupling means to reflect said anti-symmetrical mode component.

3. An acoustic surface wave filter as set forth in claim 2, wherein said effective periodicity of said first coupling means for signals within said stop band is substantially one-half the acoustic wavelength for said symmetrical mode component and wherein said effective periodicity of said second coupling means for signals within said stop band is substantially one-half the acoustic wavelength for said anti-symmetrical mode component.

4. An acoustic surface wave filter as set forth in claim 3, wherein each of said coupler elements within said first coupling means includes a first group of filamentary conductors and wherein each of said coupler elements within said second coupling means includes a second group of filamentary conductors.

5. An acoustic surface wave filter as set forth in claim 4, wherein said transmitting and receiving transducer means are offset with respect to said multistrip coupler.

6. An acoustic surface wave filter as set forth in claim 5, wherein said first groups of filamentary conductors each include an electrically connected pair of conductors having a center-to-center spacing substantially equal to one-fourth of the acoustic wavelength of signals within said predetermined range.

7. An acoustic surface wave filter as set forth in claim 6, wherein said second groups of filamentary conductors each include a first continuous conductor and a second conductor having a discontinuity at its approximate center, said first and second conductors being substantially spaced apart one-fourth of the acoustical wavelength of signals within said predetermined range.

* * * * *